United States Patent [19]
Shen et al.

[11] Patent Number: 5,948,703
[45] Date of Patent: Sep. 7, 1999

[54] METHOD OF SOFT-LANDING GATE ETCHING TO PREVENT GATE OXIDE DAMAGE

[75] Inventors: Lewis Shen, Cupertino; Wenge Yang, Fremont, both of Calif.

[73] Assignee: Advanced Micro Devices, Inc., Sunnyvale, Calif.

[21] Appl. No.: 09/092,924

[22] Filed: Jun. 8, 1998

[51] Int. Cl.$^6$ ................................. H01L 21/00
[52] U.S. Cl. .................. 438/714; 438/706; 438/700; 438/719
[58] Field of Search .................. 438/709, 710, 438/711, 714

[56] References Cited

U.S. PATENT DOCUMENTS

| | | | |
|---|---|---|---|
| 5,167,762 | 12/1992 | Carr et al. | 438/714 |
| 5,242,536 | 9/1993 | Schoenborn | 438/714 |
| 5,336,365 | 8/1994 | Goda et al. | 438/417 |
| 5,346,586 | 9/1994 | Keller | 438/714 |
| 5,370,767 | 12/1994 | Miyakuni et al. | 438/714 |
| 5,583,737 | 12/1996 | Collins et al. | |
| 5,629,235 | 5/1997 | Liu | 438/714 |
| 5,652,170 | 7/1997 | Keller et al. | 438/714 |

*Primary Examiner*—Benjamin Utech
*Assistant Examiner*—Duy-Vo Deo

[57] ABSTRACT

A soft-landing etch process is provided to form an oxide layer with uniform thickness on an open area between flash memory transistors on a substrate. A dielectric oxide layer, such as silicon dioxide, is formed on a semiconductor substrate. A polysilicon layer used to form gates of flash memory transistors is then formed on the oxide layer. The polysilicon layer is covered with a layer of conductive material, such as tungsten silicide (WSi). A cap polysilicon layer is deposited on the conductive layer. An anti-reflecting coating, such as SiON, is formed on the cap polysilicon layer. A photo-resist mask comprising a pattern defining a gate is formed on the surface of the anti-reflecting coating. The softlanding etch process performed to expose oxide layer on the substrate area between flash memory transistors includes three etch steps. The first etch step is carried out to remove materials covering the gate polysilicon layer on the area between flash memory transistors. Then, the second etch step having high polysilicon-to-oxide selectivity is performed to remove polysilicon covering the oxide layer on the open area. The third etch step is conducted to clean polysilicon residues from the oxide layer surface on the open area.

17 Claims, 8 Drawing Sheets

METHOD OF SOFT-LANDING GATE ETCHING TO PREVENT GATE OXIDE DAMAGE

FIELD OF THE INVENTION

The present invention relates to manufacturing semiconductor devices, and in particular, to etching carried out to form a gate oxide layer with uniform thickness.

BACKGROUND ART

The escalating demands for reducing thickness of oxide gate layers associated with ultra large scale integration require responsive changes in etching techniques. In MOS structures, polysilicon serves as the gate material. The gate length is a critical dimension that determines the channel lengths of devices. Thus, it is paramount that the etched linewidth dimension faithfully reproduces the dimension on the mask. A polysilicon etch process must, therefore, exhibit excellent linewidth control, and high uniformity of etching. In addition, a high degree of anisotropy is also generally required, as the doping of the source-drain and the polysilicon itself is typically performed by ion implantation.

If the etch process produces sloped sidewalls in the polysilicon, then portions of the gate would not be thick enough to effectively mask the substrate against the implantation. This would produce devices whose channel length depends on the degree of sidewall taper.

The degree of anisotropy is dictated by other considerations as well, including the extent of overetching required to remove stringers at the base of steep steps in the underlying topography, and the coverage of the etched polysilicon features by subsequently deposited layers. In the first of these cases, completely anisotropic etching will require extensive overetching to remove the stringers, while in the second, it will produce features that may be difficult for overlying films to cover.

Finally, the polysilicon layer is usually deposited over thin gate oxide, such as silicon dioxide, 50–500 Å thick. Thus, the etch process should be selective over oxide etching, since if the oxide layer is removed, the shallow source-drain junction regions in the underlying silicon substrate would be rapidly etched by the reactants that cause polysilicon etching.

Typically, etching is conducted by utilizing an etching apparatus which generates a high-density plasma, e.g., a high-density chlorine plasma. Such a high-density plasma etching technique comprises feeding chlorine gas into an etching apparatus, such as a Transformer Coupled Plasma (TCP) source type of apparatus to generate a high-density plasma with $Cl^{31}$ as the etching species. Other types of etching apparatus using other high-density plasma sources also can be used. For example, etching can be conducted with an Electron Cyclotron Resonance (ECR) type apparatus, a Helicon Resonant Inductive Coupled plasma source type apparatus or a Decoupled Plasma Source (DPS) type of apparatus.

A conventional etching technique is illustrated in FIGS. 1 through 3 with an example of manufacturing flash memory transistor devices. As illustrated in FIG. 1, an oxide layer 10, such as silicon dioxide, is formed on a semiconductor substrate (not shown). A polysilicon (poly-2) layer 12 is then formed on the oxide layer 10. The polysilicon layer 12 is used to form a gate of a flash memory transistor. The polysilicon layer 12 is covered with a layer 14 of conductive material, such as tungsten silicide. A cap polysilicon layer 16 is deposited on the conductive layer 14 to prevent the gate from lifting. An anti-reflecting coating 18, such as SiON, is formed on the cap polysilicon layer 16. A photo-resist mask 20 is next formed on the surface of the anti-reflecting coating 18. The photo-resist mask 20 comprises a pattern defining an area to be etched. The use of the layers 10–20 are conventional, as well as the technique for depositing the various layers.

Accordingly, the function and description of such known components and deposition techniques are not set forth herein in detail.

As depicted in FIG. 2, etching is then conducted to remove the layers covering the oxide layer in an area between flash memory transistors. Etching may be performed utilizing a high-density plasma, such as a high-density chlorine plasma generated by an etching apparatus into which chlorine gas is fed at a flow rate of about 50 sccm to about 200 sccm. The etching process is monitored in a conventional manner by optical spectrum monitoring.

Etching is continued until the poly-2 material is substantially removed. Then, as illustrated in FIG. 3, an etching process is performed to remove poly-2 residues. As a result, only oxide layer 10 remains on an open area between two flash memory transistors 22.

Such inherent factors of polysilicon etching, as the non-uniformity of the plasma, low sensitivity of the end point detection, and low selectivity of the etch process over oxide etching, adversely impact the control of oxide thickness uniformity. Therefore, the oxide layer 10 is partially removed during the poly etch process, and the remaining gate oxide layer will have non-uniform thickness. As the oxide layer 10 is very thin, its non-uniform thickness may result in damaging the underlying substrate during the etch process.

As gate oxide thickness has grown smaller with each generation of integrated circuits, it would be desirable to create an etching process that provides uniform gate oxide thickness and prevents the substrate from being damaged.

DISCLOSURE OF THE INVENTION

Accordingly, one advantage of the present invention is in providing an etch method for forming oxide layers having uniform thickness.

Another advantage of the present invention is in providing an etch method that prevents an underlying substrate from being damaged.

These and other advantages of the invention are achieved at least in part by providing a method of manufacturing a semiconductor device comprising the steps of forming an oxide layer, forming a polysilicon layer on the oxide layer, forming a layer of conductive material on the polysilicon layer, and forming a mask defining elements of the semiconductor device. A first etching step is performed to etch the conductive layer through the mask with a high-density plasma generated by a first gas mixture, until substantially all of the conductive material is removed between the elements. Next, a second etching step is performed to etch the polysilicon layer with a high-density plasma generated by a second gas mixture, until the oxide layer is exposed between the elements. Then, a third etching step is performed with a high-density plasma generated by a third gas mixture, to remove polysilicon residues from a surface of the oxide layer between the elements.

In accordance with a preferred embodiment of the present invention, the second etching step may have a higher polysilicon-to-oxide selectivity than the first etching step.

For example, the first gas mixture may contain chloride, helium oxygen and nitrogen. The first etch step may be performed with an etch rate for the conductive material ranging from about 2000 to about 4000 Å/min, and a polysilicon etch rate ranging from about 2000 to about 4000 Å/mmn. A plasma power may be from about 500 to about 2000 Watt.

The second gas mixture may contain chloride, hydrogen bromide and helium oxygen. The second etching step may be performed with a polysilicon etch rate ranging from about 1000 to about 2000 Å/min, an oxide etch rate ranging from about 100 to about 200 Å/min, and an etch rate for the conductive material ranging from about 500 to about 1500 Å/min. A plasma power may be from about 100 to about 500 Watt.

The third gas mixture may contain hydrogen bromide and helium oxygen.

The third etch step may be performed with a polysilicon etch rate ranging from about 500 to about 1000 Å/min, and an oxide etch rate ranging from about 5 to about 40 Å/min.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Although the invention has general applicability in the field of semiconductor processing, the best mode for practicing invention is disclosed with an example of etching process for manufacturing flash memory transistor devices.

Etching is conducted by utilizing a conventional etching apparatus which generates a high-density plasma, e.g., a high-density chlorine-based plasma. Typical plasma etching systems comprise a plasma reaction chamber evacuated to reduced pressures, a pumping system for establishing and maintaining the reduced pressure, pressure gauges to monitor pressure in the chamber, control means arranged between the pump and the chamber to provide independent control of the pressure and flow rate in the chamber, a radio-frequency (RF) power supply to create the glow discharge, gas handling means that meter and control the flow of reactant gases, and electrodes.

Figure 4:
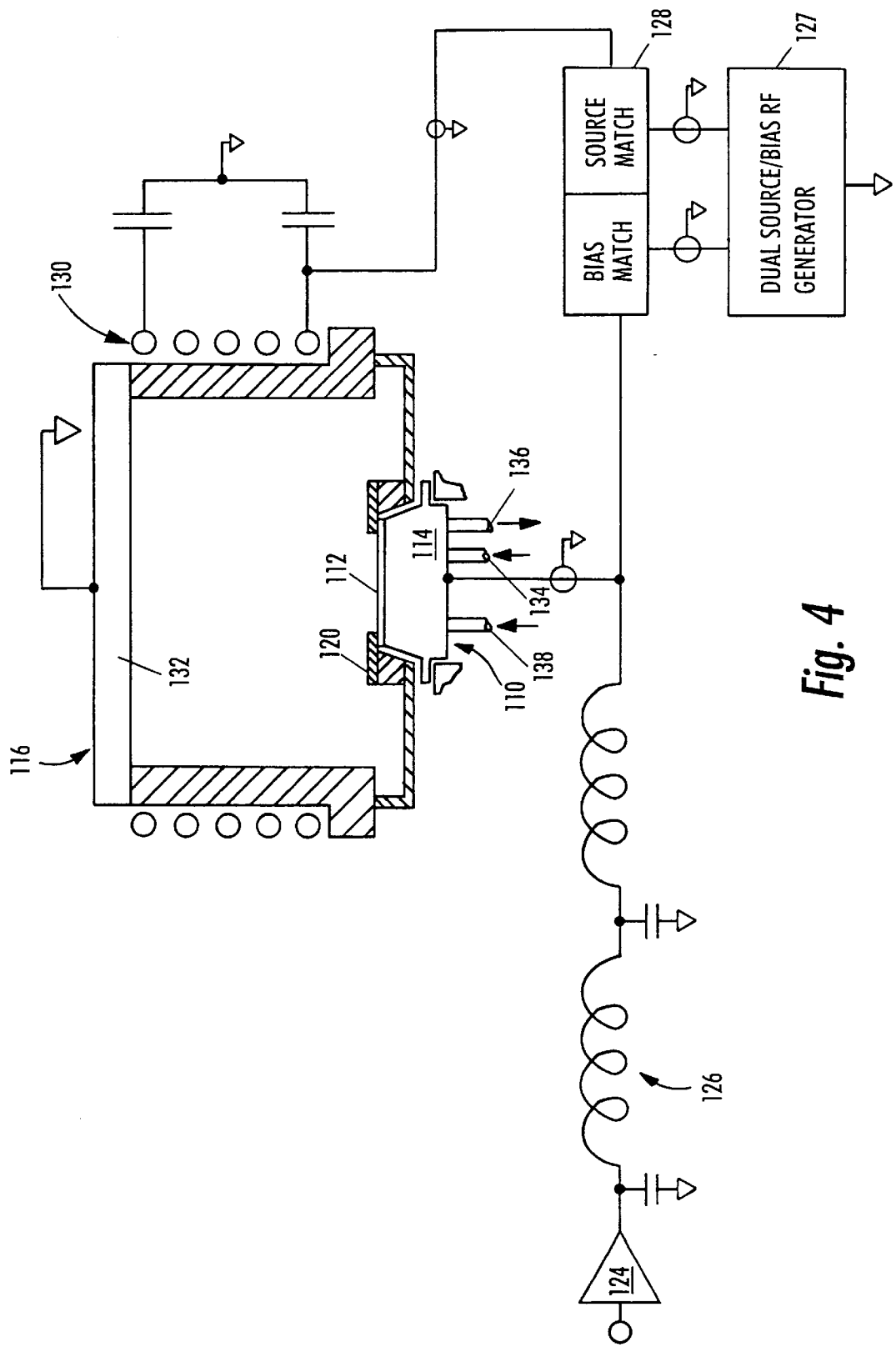
FIG. 4 shows an exemplary high-density plasma-processing chamber, which may be used for etching in accordance with the present invention.

For example, FIG. 4 illustrates a high-density plasma reaction chamber manufactured by Applied Material Inc., Santa Clara, California, that may be used to provide etching in accordance with the present invention. As shown in FIG. 4, an electrostatic chuck 110 may hold an article or workpiece 112 to be processed, such as a semiconductor wafer, on a pedestal 114 within a high-density plasma reaction chamber 116. Alternatively, a mechanical chuck may be used.

The plasma reaction chamber 116 may include a DC voltage source 124 that supplies DC voltage for developing an electric field to electrostatically hold the wafer 112 on the pedestal 114. The DC voltage source 124 is coupled to the chuck 110 via a low-pass filter 126 isolating the DC voltage source from an RF power supply 127 which provides RF source power and RF bias power. Matching networks 128 are used to supply the RF bias power to the pedestal 114, and to provide the RF source power to an external inductive antenna 130.

The plasma reaction chamber 116 employs inductively coupled RF power to generate and maintain a high-density, low energy plasma. RF bias power is capacitively coupled to the plasma via the wafer 112 and the chuck 110. A grounded top counter electrode 132 located in a plasma source region provides a return path for bias current. Etch rate is controlled by RF source power, which defines the total amount of reactive ions generated in the reaction chamber 116. Bias power independently controls ion bombardment energy at the wafer surface. When bias power increases, the ion energy at the wafer surface also increases.

To provide uniform supply of RF bias power to the wafer, the pedestal 114 may comprise a liquid cooling block. Liquid cooling is provided by water entering the pedestal 114 via an inlet 134 and travelling through cooling passages (not shown) to exit through an outlet 136. Typically, for high-density plasma processing applications, a cooling gas is required to improve the heat transfer between the wafer and the chuck. A cooling gas, such as helium, may be fed to the pedestal through an inlet 138. The high-density plasma reactor using electromagnetic RF coupling is described in more detail in U.S. Pat. No. 5,583,737.

As discussed above, conventional etching processes used for etching a polysilicon layer covering a gate oxide layer involve a single etching operation carried out until the oxide layer is reached. However, such inherent factors of polysilicon etching, as the non-uniformity of the plasma, low sensitivity of the end point detection, and low selectivity of the etch process over oxide etching, adversely impact the control of oxide thickness uniformity. Therefore, as a result of the polysilicon etching, the underlying oxide layer will have non-uniform thickness. Moreover, as the oxide layer is very thin, its non-uniform thickness may result in damaging the underlying substrate during the etch process.

Figure 1:
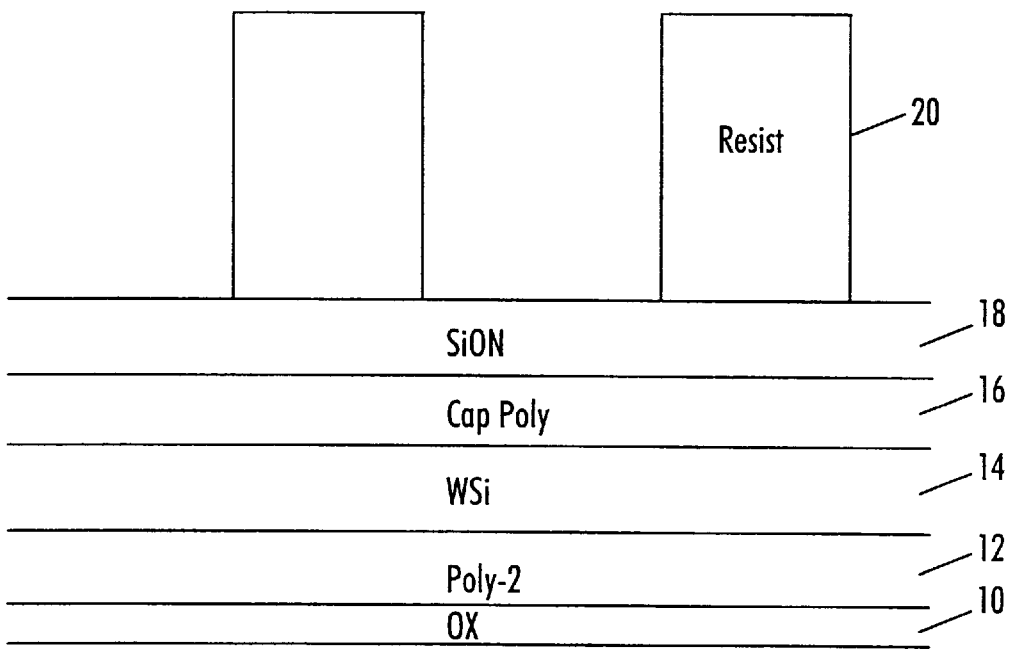
FIGS. 1–3 illustrate a conventional etch process.
Figure 2:
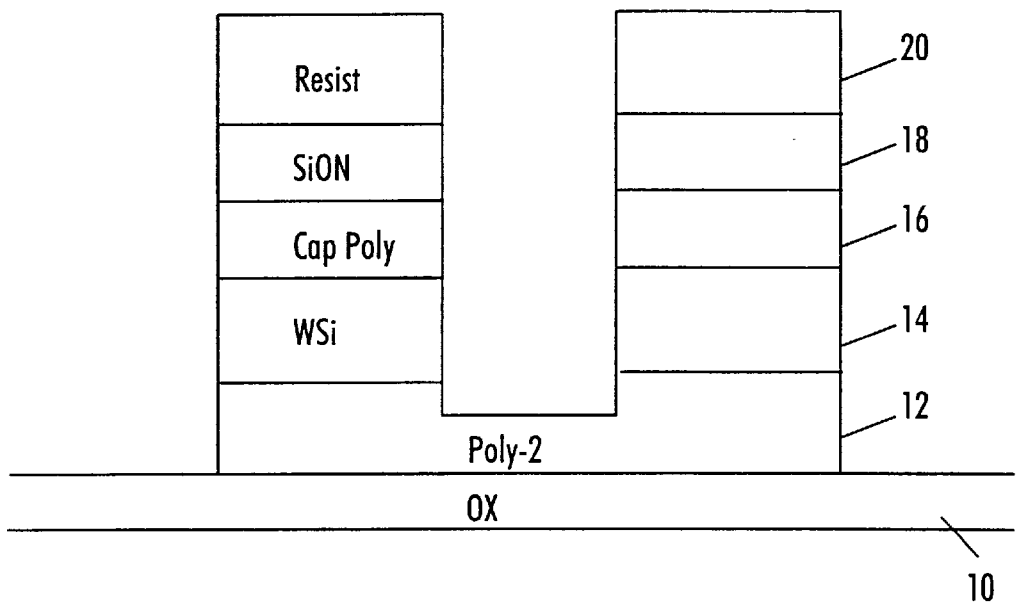
Figure 3:
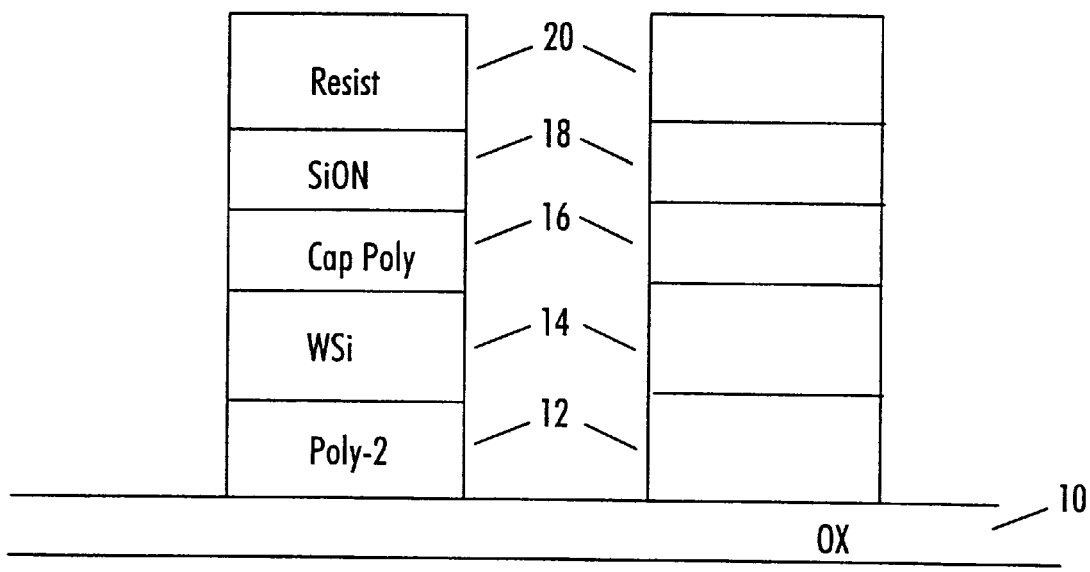

A soft-landing etching method of the present invention provides the uniform oxide layer thickness, and prevents the underlying substrate from being damaged during etching. The soft-landing etching method of the present invention is disclosed with an example of a process for manufacturing flash memory transistors illustrated in FIGS. 5–8, wherein elements similar to those depicted in FIGS. 1–3 bear like reference numerals.

Figure 5:
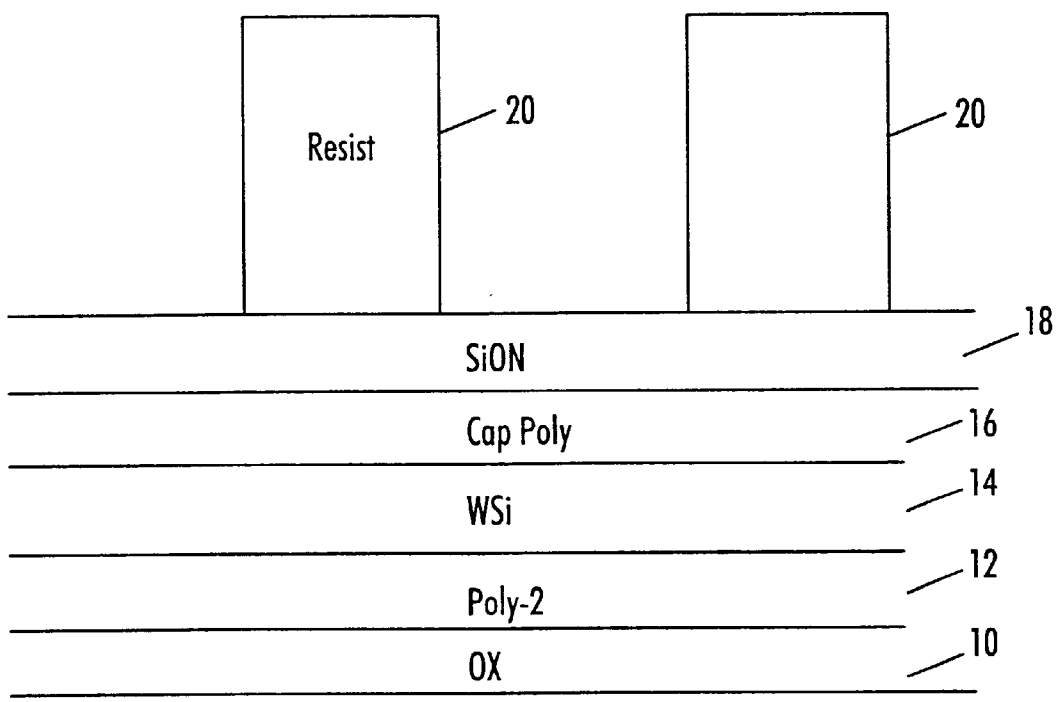
FIGS. 5–8 illustrate a soft-landing etch process in accordance with the present invention.

As shown in FIG. 5, a dielectric oxide layer 10, such as silicon dioxide, is formed on a semiconductor substrate (not shown). A polysilicon (poly-2) layer 12 used to form gates of flash memory transistors is then formed on the oxide layer 10. The polysilicon layer 12 is covered with a layer 14 of conductive material, such as tungsten silicide (WSi). A cap polysilicon layer 16 is deposited on the conductive layer 14 to prevent the gates from lifting. An anti-reflecting coating 18, such as SION, is formed on the cap polysilicon layer 16. A photo-resist mask 20 is next formed on the surface of the anti-reflecting coating 18. The photo-resist mask 20 comprises a pattern defining arrangement of flash transistors 22. The use of the oxide layer 10, poly-2 layer 12, tungsten silicide layer 14, cap polysilicon layer 16, SiON layer 18 and photo-resist layer 20 for manufacturing flash memory transistors 22 is conventional, as well as the technique for depositing the layers.

Etching is then conducted to remove materials covering the oxide layer 10 between flash memory transistors 22. In accordance with the present invention, a soft-landing etch method comprises three etch steps performed to form the gate oxide layer having uniform thickness.

Figure 6:
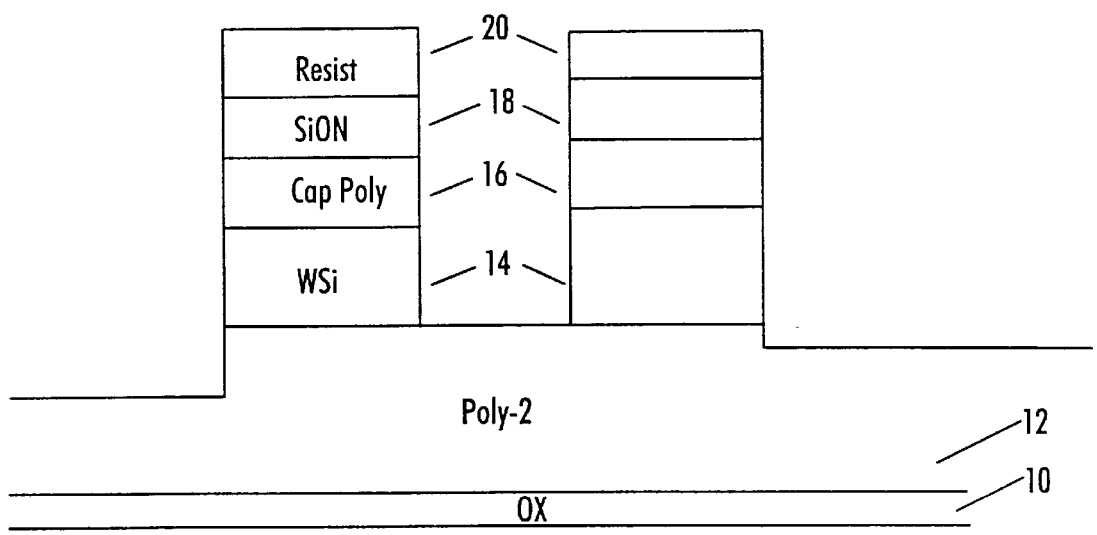

As shown in FIG. 6, the first etch step is carried out through the mask 20 to remove tungsten silicide, cap polysilicon, and SiON between flash memory transistors 22. The etching is performed until substantially all tungsten suicide between the flash memory transistors 22 is removed.

The poly-2 layer 12 may be partially removed during tungsten silicide etching, however the remaining polysilicon covers the oxide layer surface completely such that the oxide is not exposed. The etch process may be monitored in a conventional manner using optical spectrum monitoring for end point detection.

The first etch step may be performed utilizing a high-density chlorine-based plasma generated by an etching apparatus. The gas mixture used for conducting the first etch step comprises chloride ($Cl_2$), helium oxygen mixture ($He-O_2$) and nitrogen ($N_2$). For example, the flow rate of chloride may be from about 50 to 200 sccm, the helium oxygen flow rate may be from about 0 to 20 sccm, and the flow rate of nitrogen may be in the range from about 0 to 20 sccm. Plasma power is set in the range from about 500 to 2000 Watt.

During the first etch step, the WSi etch rate is selected in the range from about 2000 to 4000 Å/min, and the poly-2 etch rate is selected from about 2000 to 4000 Å/min.

Figure 7:
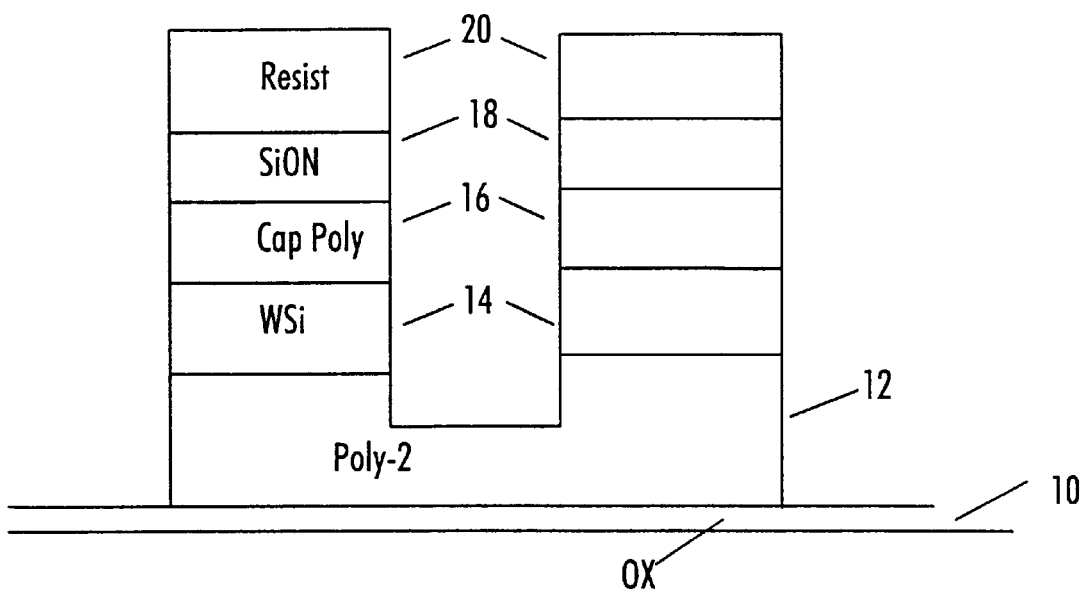

Referring to FIG. 7, after tungsten silicide is removed, the second etch step is performed through the mask 20 to remove poly-2 between the flash memory transistors 22. The second etch step is carried out until the top surface of the oxide layer is exposed. The end point of the second etch step may be detected in a conventional way using optical spectrum monitoring.

The second etch step uses an etch recipe that provides polysilicon etching with high polysilicon-to-oxide selectivity. The etch gas mixture used to conduct the second etch step comprises chloride, hydrogen bromide (HBr) and helium oxygen mixture ($He-O_2$). For example, the flow rate of chloride is maintained in the range from about 0 to 100 sccm, the hydrogen bromide flow rate is between about 50 and 150 sccm, and the helium oxygen mixture flow rate is in the range from about 0 to 20 sccm. Plasma power is set in the range from about 100 to 500 Watt.

During the second etch step, etch rates for various layers are substantially lower than etch rates for the corresponding layers during the first etch step. In particular, WSi residues are etched during the second etch step at a rate from about 500 to 1500 Å/min. The etch rate of the poly-2 layer 12 is maintained in the range from about 1000 to 2000 Å/min. The oxide etch rate is from about 100 to 200 Å/min.

Figure 8:
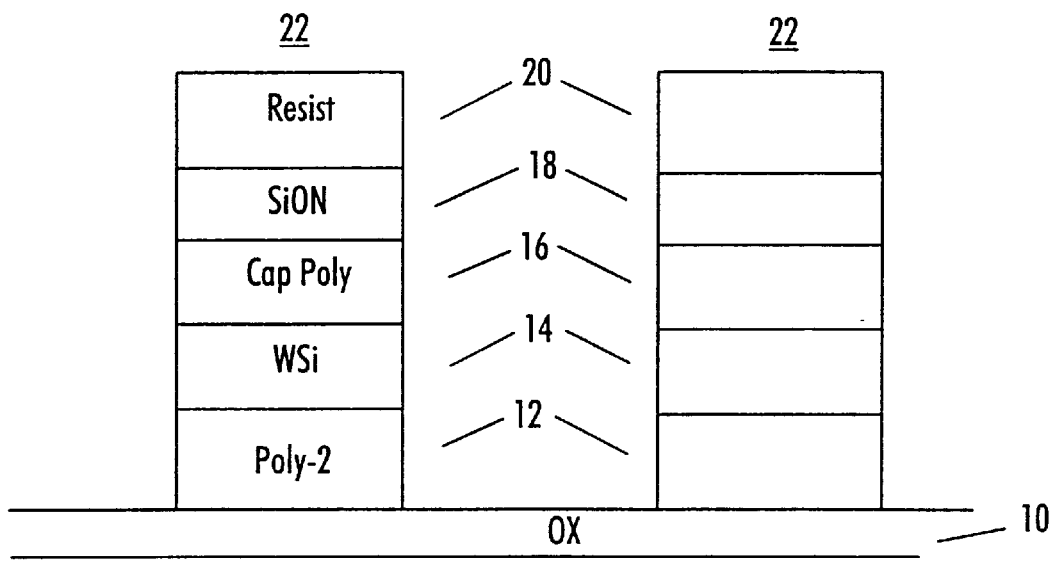

Referring to FIG. 8, after the oxide layer 10 is exposed, the third etch step is carried out through the mask 20 to remove poly-2 residues from the surface of the oxide layer 10. As a result, the oxide layer 10 having uniform thickness remains on an open area between two flash memory transistors 22 on the substrate. The third etch step is performed using an etch recipe that provides etching with higher polysilicon-to-oxide selectivity. The etch gas mixture comprises HBr and $He-O_2$. For example, the flow rate of HBr may be in the range from about 50 to 150 sccm, and the $He-O_2$ flow rate may be between about 0 and 10 sccm. Very low etch rates are used for performing the third etch step. For example, the polysilicon etch rate may be from about 500 to 1000 Å/min, and the oxide etch rate may be selected from about 5 to 40 Å/min.

Thus, in accordance with the present invention, the first etch step is stopped after the conductive layer covering the gate polysilicon layer is removed.

Thereafter, an additional polysilicon etch step having high polysilicon-to-oxide selectivity is carried out to remove polysilicon and expose the oxide layer on an open area between flash memory transistors. The third etch step having higher polysilicon-to-oxide selectivity is performed to remove polysilicon residues from the open area. Accordingly, a soft-landing etch process is performed to etch various layers covering the gate oxide layer. The soft-landing etch process results in forming an oxide layer with uniform thickness on an open area between flash memory transistors.

As the oxide layer covering the substrate has uniform thickness, no regions of the substrate are exposed to etching. As a result, the substrate is prevented from being damaged during the soft-landing etch process.

Although the present invention is described with the example of manufacturing flash memory transistors, it is not intended that the invention be limited thereto. The soft-landing etch method of the present invention may be used for providing uniform thickness of any oxide layer covered with a polysilicon layer. There accordingly has been described a soft-landing etch process performed to form an oxide layer with uniform thickness on an open area between flash memory transistors on a substrate. A dielectric oxide layer, such as silicon dioxide, is formed on a semiconductor substrate. A polysilicon layer used to form gates of flash memory transistors is then formed on the oxide layer. The polysilicon layer is covered with a layer of conductive material, such as tungsten silicide (WSi). A cap polysilicon layer is deposited on the conductive layer. An anti-reflecting coating, such as SiON, is formed on the cap polysilicon layer. A photo-resist mask comprising a pattern defining a gate is formed on the surface of the anti-reflecting coating. The soft-landing etch process performed to expose oxide layer on the substrate area between flash memory transistors includes three etch steps. The first etch step is carried out to remove materials covering the gate polysilicon layer on the area between flash memory transistors. Then, the second etch step having high polysilicon-to-oxide selectivity is performed to remove polysilicon covering the oxide layer on the open area. The third etch step is conducted to clean polysilicon residues from the oxide layer surface on the open area.

In this disclosure, there are shown and described only the preferred embodiments of the invention, but it is to be understood that the invention is capable of changes and modifications within the scope of the inventive concept as expressed herein.

What is claimed is:

1. A method of manufacturing a semiconductor device, comprising:

forming an oxide layer, forming a polysilicon layer on the oxide layer, forming a layer of conductive material on the polysilicon layer, forming a mask defining elements of the semiconductor device, performing a first etching step to etch the conductive layer through the mask with a high density plasma generated by a first gas mixture, until substantially all of the conductive material is removed between the elements, performing a second etching step to etch the polysilicon layer with a high density plasma generated by a second gas mixture, until the oxide layer is exposed between the elements, and performing a third etching step with a high-density plasma generated by a third gas mixture, to remove polysilicon residues from a surface of the oxide layer between the elements, wherein the second etching step has a higher polysilicon-tooxide selectivity than the first etching step.

2. The method of claim 1, wherein the second gas mixture contains chloride and hydrogen bromide.

3. The method of claim 2, wherein the second gas mixture further contains helium oxygen mixture.

4. The method of claim 3, wherein a flow rate of chloride in the second gas mixture is set in the range from about 0 to about 100 sccm.

5. The method of claim 4, wherein a flow rate of hydrogen bromide in the second gas mixture is set in the range from about 50 to about 150 sccm.

6. The method of claim 5, wherein a flow rate of helium oxygen mixture in the second gas mixture is set in the range from about 0 to about 20 sccm.

7. The method of claim 1, wherein the second etching step is performed with a polysilicon etch rate ranging from about 1000 to about 2000 Å/min.

8. The method of claim 1, wherein the second etching step is performed with an oxide etch rate ranging from about 100 to about 200 Å/min.

9. The method of claim 1, wherein the second etch step is performed with an etch rate of the conductive material ranging from about 500 to about 1500 Å/min.

10. The method of claim 1, wherein the second etch step is performed at a plasma power ranging from about 100 to about 500 Watt.

11. The method of claim 1, wherein the first gas mixture contains chloride, helium oxygen mixture and nitrogen.

12. The method of claim 1, wherein the first etch step is performed with an etch rate of the conductive material ranging from about 2000 to about 4000 Å/min.

13. The method of claim 1, wherein the first etch step is performed with a polysilicon etch rate ranging from about 2000 to about 4000 Å/min.

14. The method of claim 1 wherein the first etch step is performed at a plasma power ranging from about 500 to about 2000 Watt.

15. The method of claim 1, wherein the third gas mixture contains hydrogen bromide and helium oxygen mixture.

16. The method of claim 1, wherein the third etch step is performed with polysilicon etch rate ranging from about 500 to about 1000 Å/min.

17. The method of claim 1, wherein the third etch step is performed with an oxide etch rate ranging from about 5 to about 40 Å/min.

\* \* \* \* \*

UNITED STATES PATENT AND TRADEMARK OFFICE
CERTIFICATE OF CORRECTION

PATENT NO. : 5,948,703
DATED : Sept. 7, 1999
INVENTOR(S) : Lewis Shen, et al.

It is certified that error appears in the above-identified patent and that said Letters Patent is hereby corrected as shown below:

Claim 1, line 22, change "polysilicon-tooxide" to --polysilicon-to-oxide--, and in Claim 14, line 2, change "perforned" to --performed--.

Signed and Sealed this

Eighth Day of February, 2000

Attest:

Attesting Officer

Q. TODD DICKINSON
Commissioner of Patents and Trademarks

UNITED STATES PATENT AND TRADEMARK OFFICE
Certificate

Patent No. 5,948,703                                                  Patented: September 7, 1999

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Lewis Shen, Cupertino, CA; Wenge Yang, Fremont, CA; and Mohit Kumar Jain, Santa Clara, CA.

Signed and Sealed this Twenty-eighth Day of December 2004.

NADINE NORTON
*Supervisory Patent Examiner*
Art Unit 1765

UNITED STATES PATENT AND TRADEMARK OFFICE
Certificate

Patent No. 5,948,703                    Patented: September 7, 1999

On petition requesting issuance of a certificate for correction of inventorship pursuant to 35 U.S.C. 256, it has been found that the above identified patent, through error and without any deceptive intent, improperly sets forth the inventorship.
 Accordingly, it is hereby certified that the correct inventorship of this patent is: Lewis Shen, Cupertino, CA; Wenge Yang, Fremont, CA; and Mohit Kumar Jain, San Jose, CA.

Signed and Sealed this Third Day of May 2005.

NADINE NORTON
                        *Supervisory Patent Examiner*
                               Art Unit 1765